(12) United States Patent
Shirakawa et al.

(10) Patent No.: US 11,355,469 B2
(45) Date of Patent: Jun. 7, 2022

(54) CONNECTION STRUCTURE AND METHOD FOR PRODUCING SAME

(71) Applicant: HITACHI CHEMICAL COMPANY, LTD., Tokyo (JP)

(72) Inventors: Tetsuyuki Shirakawa, Tokyo (JP); Takahiro Fukui, Tokyo (JP); Shinnosuke Iwamoto, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 0 days.

(21) Appl. No.: 16/957,568

(22) PCT Filed: Dec. 27, 2018

(86) PCT No.: PCT/JP2018/048242
§ 371 (c)(1),
(2) Date: Jun. 24, 2020

(87) PCT Pub. No.: WO2019/131904
PCT Pub. Date: Jul. 4, 2019

(65) Prior Publication Data
US 2020/0321305 A1    Oct. 8, 2020

(30) Foreign Application Priority Data

Dec. 28, 2017   (JP) .............................. JP2017-254726

(51) Int. Cl.
*H01L 23/00*    (2006.01)

(52) U.S. Cl.
CPC .............. *H01L 24/32* (2013.01); *H01L 24/29* (2013.01); *H01L 2224/29144* (2013.01);
(Continued)

(58) Field of Classification Search
CPC .......... H01L 24/32; H01L 2224/83486; H01L 2224/8349; H01L 24/29
See application file for complete search history.

(56) References Cited

U.S. PATENT DOCUMENTS 6,787,233 B1    9/2004  Molteberg
10,633,559 B2*  4/2020  Engeldinger .............. C09J 5/06
(Continued)

FOREIGN PATENT DOCUMENTS

CN    103548207 A    1/2014
CN    103764776 A    4/2014
(Continued)

*Primary Examiner* — Dale E Page
*Assistant Examiner* — Wilner Jean Baptiste
(74) *Attorney, Agent, or Firm* — Fitch, Even, Tabin & Flannery, LLP

(57) ABSTRACT

One aspect of the invention is a method of manufacturing a connection structure, including disposing an adhesive layer between a first electronic member including a first substrate and a first electrode formed on the first substrate and a second electronic member including a second substrate and a second electrode formed on the second substrate, and pressure-bonding the first electronic member and the second electronic member via the adhesive layer such that the first electrode and the second electrode are electrically connected to each other, wherein the first electronic member further including an insulating layer formed on a side of the first electrode opposite to the first substrate, and the adhesive layer including: a first conductive particle being a dendritic conductive particle; and a second conductive particle being a conductive particle other than the first conductive particle and having a non-conductive core and a conductive layer provided on the core.

12 Claims, 4 Drawing Sheets

(52) U.S. Cl.
 CPC ............... *H01L 2224/29155* (2013.01); *H01L 2224/29164* (2013.01); *H01L 2224/32145* (2013.01)

(56) References Cited

U.S. PATENT DOCUMENTS

| | | |
|---|---|---|
| 2001/0028953 A1 | 10/2001 | Bluem et al. |
| 2008/0230749 A1 | 9/2008 | Matsuse et al. |
| 2009/0133900 A1* | 5/2009 | Nishikawa ............ H01L 21/6835 174/250 |
| 2009/0189254 A1* | 7/2009 | Kaneya ................... H01L 24/83 257/618 |
| 2012/0177930 A1 | 7/2012 | Henckens |
| 2015/0129812 A1 | 5/2015 | Scherf et al. |
| 2019/0241770 A1 | 8/2019 | Shirakawa et al. |

FOREIGN PATENT DOCUMENTS

| | | |
|---|---|---|
| JP | H10-116640 A | 5/1998 |
| JP | 2003-045229 A | 2/2003 |
| JP | 2006-108523 A | 4/2006 |
| JP | 2012-028334 A | 2/2012 |
| JP | 2014-078478 A | 5/2014 |
| JP | 2015-097240 A | 5/2015 |
| TW | 201348400 A | 12/2013 |
| TW | 201739327 A | 11/2017 |
| WO | 01/064807 A1 | 9/2001 |
| WO | 2013/035164 A1 | 3/2013 |
| WO | 2013/150907 A1 | 10/2013 |
| WO | 2014/021037 A1 | 2/2014 |

* cited by examiner (b)

(c)

(d)

CONNECTION STRUCTURE AND METHOD FOR PRODUCING SAME

CROSS-REFERENCE TO RELATED APPLICATIONS

This application is a U.S. national phase application filed under 35 U.S.C. § 371 of International Application No. PCT/JP2018/048242, filed Dec. 27, 2018, designating the United States, which claims priority from Japanese Patent Application 2017-254726, filed Dec. 28, 2017, which are hereby incorporated herein by reference in their entirety.

TECHNICAL FIELD

The present invention relates to a connection structure and a method of manufacturing the same.

BACKGROUND ART

In recent years, various adhesives have been used in the fields of semiconductors, liquid crystal displays, and the like for fixing electronic components, connecting circuits, and the like. In these applications, higher integration density and higher fineness of electronic components, circuits, and the like are progressed, and adhesives are required to have a higher level of performance.

An adhesive having conductive particles dispersed in the adhesive has been used in, for example, connection between a liquid crystal display and a TCP (Tape Carrier Package), connection between an FPC (Flexible Printed Circuit) and a TCP, or connection between an FPC and a printed wiring board. Such an adhesive is required to further enhance the conductivity between adherends, and reliability.

For example, Patent Literature 1 describes a conductive film comprising a conductive layer containing predetermined silver-coated dendritic copper powder particles on a substrate film, and discloses that such a conductive film can provide sufficient conductive properties without including a silver powder.

CITATION LIST

Patent Literature

Patent Literature 1: International Publication No. WO 2014/021037

SUMMARY OF INVENTION

Technical Problem

In the manufacturing process of an electronic member, an insulating layer may be formed on an electrode. In this case, when the electronic members are connected to each other, the insulating layer is generally removed in advance in order to satisfactorily connect the electrodes to each other. However, since the step of removing the insulating layer becomes a burden in the manufacturing process of the electronic member, it is required that the electronic members can be connected to each other without removing the insulating layer, and furthermore, it is desirable that the pressure at the time of the connection is low (for example, about 1.0 MPa).

Therefore, an object of the present invention is to provide a method of manufacturing a connection structure and a connection structure which are capable of connecting an electronic member having an insulating layer formed thereon at a low pressure.

Solution to Problem

One aspect of the present invention is a method of manufacturing a connection structure, comprising disposing an adhesive layer between a first electronic member comprising a first substrate and a first electrode formed on the first substrate and a second electronic member comprising a second substrate and a second electrode formed on the second substrate, and pressure-bonding the first electronic member and the second electronic member via the adhesive layer such that the first electrode and the second electrode are electrically connected to each other, wherein the first electronic member further comprises an insulating layer formed on a side of the first electrode opposite to the first substrate, and wherein the adhesive layer comprises: a first conductive particle being a dendritic conductive particle; and a second conductive particle being a conductive particle other than the first conductive particle and the second conductive particle comprising a non-conductive core and a conductive layer provided on the core.

Another aspect of the present invention is a connection structure comprising: a first electronic member comprising a first substrate, a first electrode formed on the first substrate, and an insulating layer formed on a side of the first electrode opposite to the first substrate; a second electronic member comprising a second substrate and a second electrode formed on the second substrate; and a connecting member connecting the first electrode and the second electrode electrically to each other, wherein the connecting member comprises: a first conductive particle being a dendritic conductive particle; and a second conductive particle being a conductive particle other than the first conductive particle and the second conductive particle comprising a non-conductive core and a conductive layer provided on the core.

In each of the above aspects, the conductive layer may comprise at least one selected from the group consisting of gold, nickel, and palladium.

Advantageous Effects of Invention

According to the present invention, it is possible to provide a method of manufacturing a connection structure and a connection structure which are capable of connecting an electronic member having an insulating layer formed thereon at a low pressure.

DESCRIPTION OF EMBODIMENTS

Hereinafter, embodiments of the present invention will be described in detail with reference to the drawings as appropriate.

Figure 1:
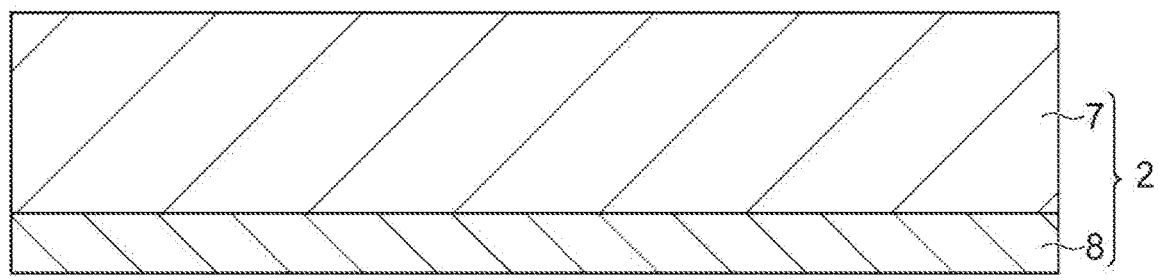
FIG. 1 is a schematic cross-sectional view showing an embodiment of a method of manufacturing a connection structure.
Figure 1:
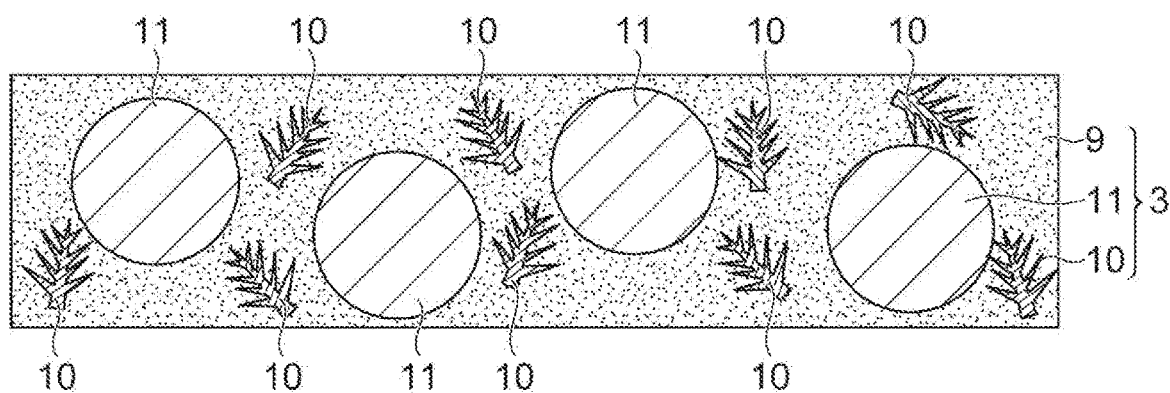
Figure 1:
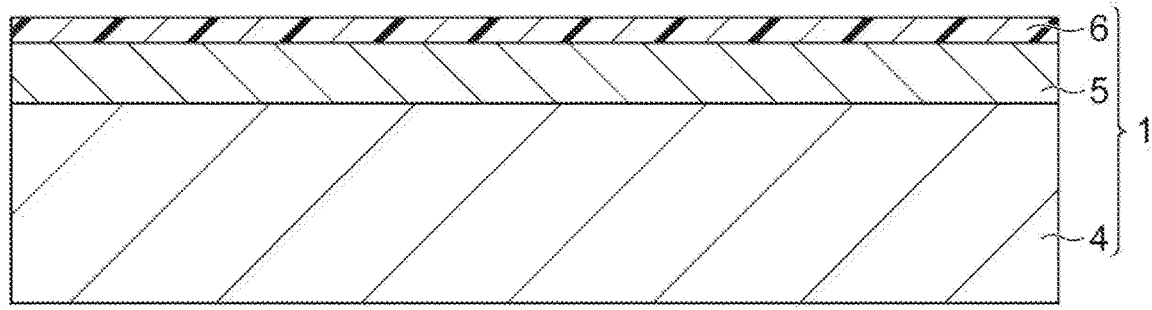

FIG. 1 is a schematic cross-sectional view showing an embodiment of a method of manufacturing a connection structure. As shown in FIG. 1, first of all, a first electronic member 1, a second electronic member 2, and an adhesive film (adhesive layer) 3 are prepared.

The first electronic member 1 includes a first substrate 4, a first electrode 5 formed on a main surface of the first substrate 4, and an insulating layer 6 formed on a side of the first electrode 5 opposite to the first substrate 4. The second electronic member 2 includes a second substrate 7 and a second electrode 8 formed on a main surface of the second substrate 7. The second electronic member may further include an insulating layer similar to that of the first electronic member 1 on the side of the second electrode 8 opposite to the second substrate 7. When the second electronic member further includes the insulating layer, the first electronic member and the second electronic member may be the same as or different from each other.

Each of the first substrate 4 and the second substrate 7 may be a substrate formed of glass, ceramic, polyimide, polycarbonate, polyester, polyethersulfone, or the like. Each of the first electrode 5 and the second electrode 8 may be an electrode formed of gold, silver, copper, tin, aluminum, ruthenium, rhodium, palladium, osmium, iridium, platinum, indium tin oxide (ITO), or the like. The thickness of each of the first electrode 5 and the second electrode 8 may be, for example, 5 µm or more, 10 µm or more, or 20 µm or more, and may be 200 µm or less, 100 µm or less, or 50 µm or less.

The insulating layer 6 is formed of, for example, a polymer such as polyolefin such as polypropylene or polyamide such as nylon. The thickness of the insulating layer 6 may be, for example, 1 µm or more, 2 µm or more, or 3 µm or more, and may be 8 µm or less, 6 µm or less, or 4 µm or less. The insulating layer 6 is formed by, for example, disposing an insulating film such as a film of the above-described polymer on the first electrode 5 which is formed on the main surface of the first substrate 4.

In one embodiment, the adhesive film 3 is formed of an adhesive layer containing an adhesive component 9 and a first conductive particle 10 and a second conductive particle 11 which are dispersed in the adhesive component 9.

The adhesive component 9 is composed of, for example, a material exhibiting curability by heat or light, and may be an epoxy type adhesive, a radically curable adhesive, and a thermoplastic adhesive containing polyurethane, polyvinyl ester or the like. Since the adhesive component 9 is excellent in heat resistance and moisture resistance after adhesion, the adhesive component may be composed of a crosslinkable material. The epoxy type adhesive contains an epoxy resin which is a thermosetting resin as a main component. The epoxy type adhesive is preferably used from the viewpoint that the epoxy type adhesive can be cured in a short time, has good connection workability, is excellent in adhesiveness, and the like. The radically curable adhesive has properties such as being excellent in curability at a low temperature in a short time as compared with the epoxy type adhesive, and is therefore suitably used according to the application.

The epoxy type adhesive contains, for example, an epoxy resin (thermosetting material) and a curing agent, and may further contain a thermoplastic resin, a coupling agent, a filler, and the like as necessary.

Examples of the epoxy resin include a bisphenol A type epoxy resin, a bisphenol F type epoxy resin, a bisphenol S type epoxy resin, a phenol novolak type epoxy resin, a cresol novolak type epoxy resin, a bisphenol A novolak type epoxy resin, a bisphenol F novolak type epoxy resin, an alicyclic epoxy resin, a glycidyl ester type epoxy resin, a glycidyl amine type epoxy resin, a hydantoin type epoxy resin, an isocyanurate type epoxy resin, and an aliphatic chain epoxy resin. These epoxy resins may be halogenated or hydrogenated, and may have a structure in which an acryloyl group or a methacryloyl group is added to a side chain. These epoxy resins are used singly or in combinations of two or more.

The curing agent is not particularly limited as long as the curing agent can cure the epoxy resin, and examples thereof include an anionic polymerization catalyst type curing agent, a cationic polymerization catalyst type curing agent, and a polyaddition type curing agent. The curing agent is preferable to be an anionic or cationic polymerization catalyst type curing agent from the viewpoint of excellent fast curability and no need for chemical equivalent consideration.

Examples of the anionic or cationic polymerization catalyst type curing agent may include an imidazole, a hydrazide, a boron trifluoride-amine complex, an onium salt (aromatic sulfonium salt, aromatic diazonium salt, aliphatic sulfonium salt, and the like), an amine imide, a diaminomaleonitrile, a melamine and its derivatives, a polyamine salt, a dicyandiamide, and these modified products. Examples of the polyaddition type curing agent include a polyamine, a polymercaptan, a polyphenol, and an acid anhydride.

These curing agents may be latent curing agents that are microencapsulated by being coated with polymer substances such as polyurethanes and polyesters, metal thin films of nickel, copper, and the like, inorganic substances such as calcium silicate. The latent curing agent is preferable since the pot life can be extended. The curing agents are used singly or in combinations of two or more.

The content of the curing agent may be 0.05 to 20 parts by mass with respect to 100 parts by mass of the total amount of the thermosetting material and the thermoplastic resin added as necessary.

A radically curable adhesive contains, for example, a radical polymerizable material and a radical polymerization initiator (also referred to as a curing agent), and may further contain a thermoplastic resin, a coupling agent, a filler, and the like, as necessary.

As the radical polymerizable material, for example, any material having a functional group which is polymerized by radical can be used without particular limitation. Specific examples of radical polymerizable materials may include an acrylate (including corresponding methacrylate, the same applies hereinafter) compound, an acryloxy (including corresponding methacryloxy, the same applies hereinafter) compound, a maleimide compound, a citraconimide resin, and a nadimide resin. These radical polymerizable materials may be in a state of a monomer or a state of an oligomer, or may be in a mixture state of a monomer and an oligomer.

Examples of an acrylate compound include methyl acrylate, ethyl acrylate, isopropyl acrylate, isobutyl acrylate, ethylene glycol diacrylate, diethylene glycol diacrylate, trimethylolpropane triacrylate, tetramethylolmethane tetraacrylate, 2-hydroxy-1,3-diacryloxypropane, 2,2-bis[4-(acryloxymethoxy)phenyl]propane, 2,2-bis[4-(acryloxypolyethoxy)phenyl]propane, dicyclopentenyl acrylate, tricyclodecanyl acrylate, tris(acryloyloxyethyl)isocyanurate, urethane acrylate, and phosphoric acid ester diacrylate.

A radical polymerizable material such as an acrylate compound may be used together with a polymerization inhibitor such as hydroquinone and methyl ether hydroquinone as necessary. From the viewpoint of improving heat resistance, the radical polymerizable material such as an acrylate compound preferably has at least one substituent such as a dicyclopentenyl group, a tricyclodecanyl group, and a triazine ring. As the radical polymerizable material other than the acrylate compound, for example, the compound described in International Publication No. WO 2009/063827 can be suitably used. The radical polymerizable materials may be used singly or in combinations of two or more.

As the radical polymerization initiator, for example, any compound capable of decomposing upon heating or irradiation with light to generate radicals can be used without particular limitation. Specific examples of the radical polymerization initiator may include a peroxide compound an azo compound. These compounds are appropriately selected depending on the target connection temperature, connection time, pot life, and the like.

More specific examples of the radical polymerization initiator preferably include diacyl peroxide, peroxy dicarbonate, peroxy ester, peroxy ketal, dialkyl peroxide, hydroperoxide, and silyl peroxide. Of these initiators, peroxy ester, dialkyl peroxide, hydroperoxide, and silyl peroxide and the like are preferable, and peroxy ester is more preferable from the viewpoint of being capable of obtaining high reactivity. As these radical polymerization initiators, for example, the compound described in International Publication No. WO 2009/063827 can be suitably used. The radical polymerization initiators are used singly or in combinations of two or more.

The content of the radical polymerization initiator may be 0.1 to 10 parts by mass with respect to 100 parts by mass of the total amount of the radical polymerizable material and the thermoplastic resin added as necessary.

The thermoplastic resin which is blended as necessary in the epoxy type adhesive and the radically curable adhesive makes it easy to provide excellent film formability to the adhesive, for example. Examples of the thermoplastic resin include a phenoxy resin, a polyvinyl formal resin, a polystyrene resin, a polyvinyl butyral resin, a polyester resin, a polyamide resin, a xylene resin, a polyurethane resin, a polyester urethane resin, a phenol resin, and a terpene phenol resin. As the thermoplastic resin, for example, the compound described in International Publication No. WO 2009/063827 can be suitably used. Of the thermoplastic resins, a phenoxy resin is preferable since adhesiveness, compatibility, heat resistance, mechanical strength, and the like are excellent. The thermoplastic resins are used singly or in combinations of two or more.

The content of the thermoplastic resin may be 5 to 80 parts by mass with respect to 100 parts by mass of the total amount of the thermoplastic resin and the thermosetting material when the thermoplastic resin is added to the epoxy type adhesive. The content of the thermoplastic resin may be 5 to 80 parts by mass with respect to 100 parts by mass of the total amount of the thermoplastic resin and the radical polymerizable material when the thermoplastic resin is added to the radically curable adhesive.

Another example of the adhesive component 9 includes a thermal radical curable adhesive containing a thermoplastic resin, a radical polymerizable material in a liquid state at 30° C., and a radical polymerization initiator. The thermal radical curable adhesive has a lower viscosity than the above adhesive component. The content of the radical polymerizable material in the thermal radical curable adhesive is preferably 20 to 80 parts by mass, more preferably 30 to 80 parts by mass, and further preferably 40 to 80 parts by mass, with respect to 100 parts by mass of the total amount of the thermoplastic resin and the radical polymerizable material.

The adhesive component 9 may be an epoxy type adhesive containing a thermoplastic resin, a thermosetting material including an epoxy resin in a liquid state at 30° C., and a curing agent. In this case, the content of the epoxy resin in the epoxy type adhesive is preferably 20 to 80 parts by mass, more preferably 40 to 80 parts by mass, and further preferably 30 to 80 parts by mass, with respect to 100 parts by mass of the total amount of the thermoplastic resin and the thermosetting material.

When the adhesive film 3 is used for connecting an IC chip and a glass substrate, a flexible printed circuit (FPC), or the like, the adhesive component 9 preferably further comprises a component that exerts an effect of relaxing the internal stress, from the viewpoint of suppressing the warping of the substrate caused by the difference in linear expansion coefficient between the IC chip and the substrate. Specific examples of such components include an acrylic rubber and an elastomer component. Alternatively, the adhesive component 9 may be a radical curable adhesive as described in International Publication No. WO 98/44067.

The volume proportion of the adhesive component 9 in the adhesive film 3 may be 55% by volume or more or 65% by volume or more, and 95% by volume or less or 85% by volume or less, based on the total volume of the adhesive film 3.

The first conductive particle 10 exhibits a dendritic shape (also referred to as a dendrite shape) and comprises one main shaft and a plurality of branches that two-dimensionally or three-dimensionally branch from the main shaft. The first conductive particle 10 may be formed from a metal such as copper or silver, and may be, for example, a silver-coated copper particle in which a copper particle is coated with silver.

The first conductive particle 10 may be known one, and specifically is available, for example, as ACBY-2 (Mitsui Mining & Smelting Co., Ltd.), CE-1110 (Fukuda Metal Foil & Powder Co., Ltd.), #FSP (JX Nippon Mining & Metals Corporation), and #51-R (JX Nippon Mining & Metals Corporation). Alternatively, the first conductive particle 10 can also be manufactured by a known method (for example, the method described in the above Patent Literature 1).

The content of the first conductive particle 10 in the adhesive film 3 (the volume proportion of the first conductive particle 10 in the adhesive film 3) may be 2% by volume or more or 8% by volume or more, and 25% by volume or less or 15% by volume or less, based on the total volume of the adhesive film 3.

The second conductive particle 11 has a nonconductive core body and a conductive layer provided on the core body. The core body is formed from a nonconductive material such as glass, ceramic, and resin, and is preferably formed from resin. Examples of the resin include an acrylic resin, a styrene resin, a silicone resin, a polybutadiene resin, or copolymers of monomers constituting these resins. The average particle diameter of the core body may be, for example, 2 to 30 μm.

The conductive layer is formed from, for example, gold, silver, copper, nickel, palladium, or an alloy thereof. From the viewpoint of excellent conductivity, the conductive layer preferably comprises at least one selected from gold, nickel, and palladium, more preferably comprises gold or palladium, and further preferably comprises gold. The conductive layer is formed, for example, by plating the above metal on the core body. The thickness of the conductive layer may be, for example, 10 to 400 nm.

The average particle diameter of the second conductive particle 11 is preferably 30 μm or less, more preferably 25

μm or less, and further preferably 20 μm or less, from the viewpoint that the film can be suitably thinned. The average particle diameter of the second conductive particle 11 may be, for example, 1 μm or more. The average particle diameters of the second conductive particle 11 and the core constituting it are measured by a particle size distribution measuring apparatus (Microtrac (product name, Nikkiso Co., Ltd.)) using a laser diffraction-scattering method.

The content of the second conductive particle 11 in the adhesive film 3 (the volume proportion of the second conductive particle 11 in the adhesive film 3) may be 2% by volume or more or 5% by volume or more, and 20% by volume or less or 10% by volume or less, based on the total volume of the adhesive film 3.

The thickness of the adhesive film 3 may be, for example, 5 μm or more, 7 μm or more, or 10 μm or more, and may be 30 μm or less, 25 μm or less, or 20 μm or less.

The adhesive layer may be prepared by, for example, applying a paste-like adhesive composition onto the first electronic member 1 or the second electronic member 2. The paste-like adhesive composition is obtained by, for example, heating a mixture containing the adhesive component, the first conductive particles, and the second conductive particles, or dissolving the mixture in a solvent. As the solvent, for example, a solvent having a boiling point of 50 to 150° C. under atmospheric pressure is used.

In the method of manufacturing the connection structure, subsequently, the adhesive film (adhesive layer) 3 is disposed between the first electronic member 1 and the second electronic member 2, and the first electronic member 1 and the second electronic member 2 are pressure-bonded to each other via the adhesive film (adhesive layer) 3. Specifically, the first electronic member 2, the adhesive film (adhesive layer) 3, and the second electronic member 1 are pressed and heated in the stacking direction such that the first electrode 5 and the second electrode 8 are electrically connected to each other. The heating temperature is, for example, 50 to 190° C. The pressure is, for example, 0.1 to 30 MPa. These heating and pressurizing are performed, for example, in the range of 0.5 seconds to 120 seconds.

Figure 2:
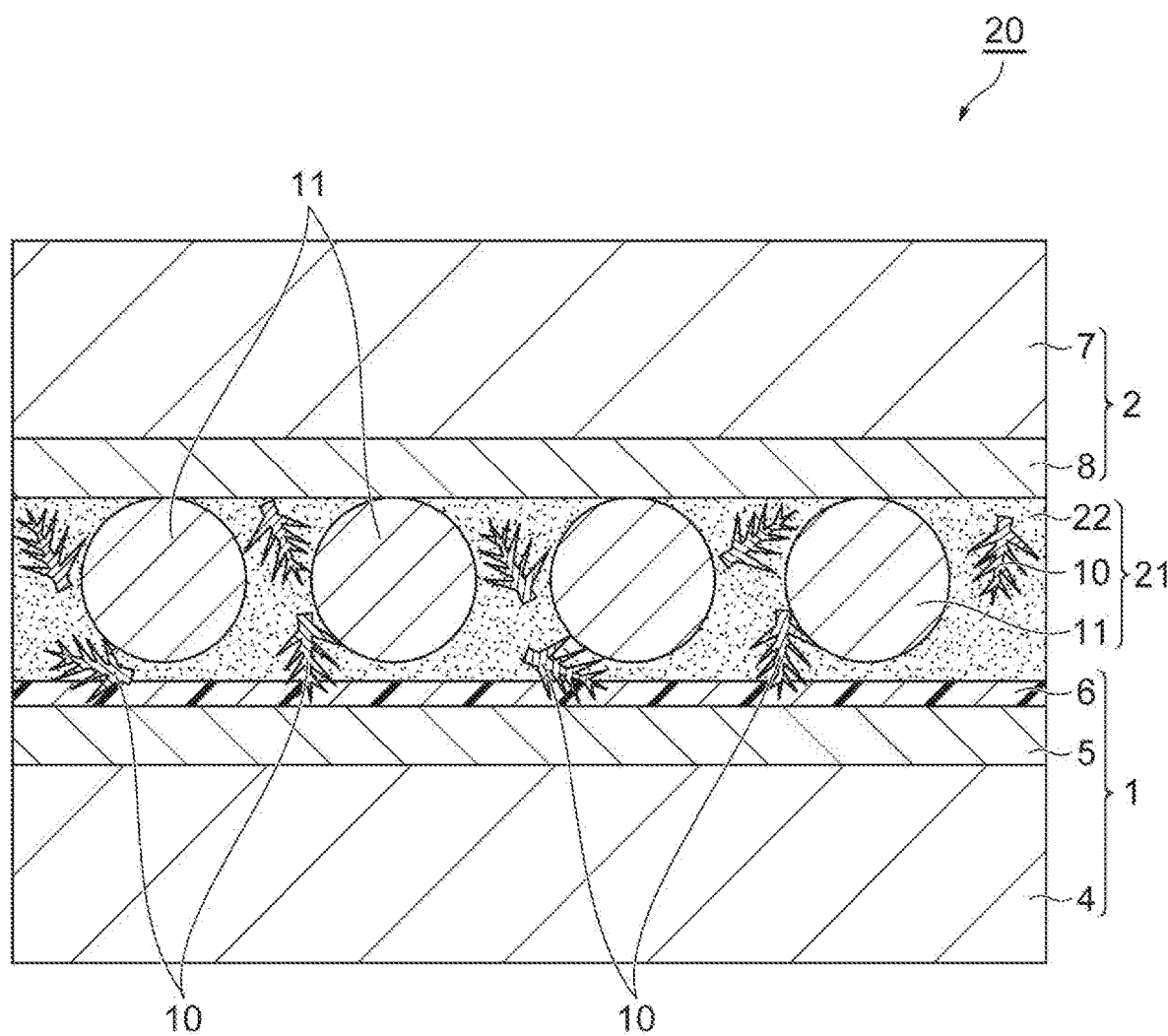
FIG. 2 is a schematic cross-sectional view showing an embodiment of a connection structure.

The connection structure is obtained by the above manufacturing method. FIG. 2 is a schematic cross-sectional view showing an embodiment of the connection structure. As shown in FIG. 2, the connection structure 20 includes a first electronic member 1 having a first substrate 4, a first electrode 5 formed on the first substrate 4, and an insulating layer 6 formed on the side of the first electrode 5 opposite to the first substrate 4, a second electronic member 2 having a second substrate 7 and a second electrode 8 formed on the second substrate 7, and a connecting member 21 connecting the first electrode 5 and the second electrodes 8 electrically to each other.

The connecting member 21 includes a cured product 22 of the adhesive component 9, the first conductive particles 10 and the second conductive particles 11 which are dispersed in the cured product 22. That is, the connecting member 21 is formed by curing the adhesive film 3.

In the method of manufacturing the connection structure according to the present embodiment, by using the first conductive particles 10 and the second conductive particles 11 in combination, the first electronic member 1 on which the insulating layer 6 can be suitably connected. That is, since the first conductive particles 10 included in the adhesive film 3 have a dendritic shape, when the electronic members 1 and 2 are pressure-bonded to each other, as shown in FIG. 2, the first conductive particles 10 can break through the insulating layer 6 and be electrically connected to the first electrode 5. In addition, since the second conductive particles 11 serve as a main conductive path for electrically connecting the first electrode 5 and the second electrode 8 to each other, a suitable connection can be achieved even at a low pressure, and reliability is excellent, as compared with, for example, a case where an adhesive film containing only the first conductive particles 10 is used.

In the above embodiment, the adhesive film 3 is composed of the adhesive layer 1 containing the adhesive component 9, the first conductive particles 10, and the second conductive particles 11, but in another embodiment, the adhesive film may be composed of two or more layers. In this case, the first conductive particles 10 and the second conductive particles 11 may be included in at least one layer of the two or more layers, and may be included in the same layer as or different layers from each other. The adhesive component 9, the first conductive particles 10, and second conductive particles 11 included in two or more layers may be the same as or different from each other.

In another embodiment, the adhesive film may include a first adhesive layer containing the first conductive particles 10 and a second adhesive layer containing the second conductive particles 11. In this case, the first adhesive layer may not contain the second conductive particles 11, and the second adhesive layer may not contain the first conductive particles 10. In the case of using the adhesive film according to this embodiment, the first adhesive layer containing the first conductive particles 10 is preferably disposed toward the first electronic member 1 having the insulating layer 6 when the adhesive film is disposed between the electronic members 1 and 2, from the viewpoint of more suitably obtaining the above-described effect that the first conductive particles 10 break through the insulating layer 6.

In another embodiment, the adhesive film may include a first adhesive layer containing the first conductive particles 10 and the second conductive particles 11 and a second adhesive layer containing no conductive particles (consisting of only the adhesive component). In the case of using the adhesive film according to this embodiment, the first adhesive layer containing the first conductive particles 10 is preferably disposed toward the first electronic member 1 having the insulating layer 6 when the adhesive film is disposed between the electronic members 1 and 2, from the viewpoint of more suitably obtaining the above-described effect that the first conductive particles 10 break through the insulating layer 6.

In addition, this adhesive film is suitably used, for example, when the second electrode 8 of the second electronic member 2 has an uneven shape. That is, in this adhesive film, since the second adhesive layer (adhesive component) containing no conductive particles easily flows, it can flow along the uneven shape of the second electrode 8 when the electronic members 1 and 2 are pressure-bonded. Therefore, since the adhesive component is satisfactorily filled between the electronic members 1 and 2, the electronic members 1 and 2 can be suitably bonded to each other.

In another embodiment, the adhesive film may include a first adhesive layer containing the first conductive particles 10, a second adhesive layer containing the second conductive particles 11, and a third adhesive layer containing the first conductive particles 10 in this order. In this case, the first adhesive layer and the third adhesive layer may not contain the second conductive particles 11, and the second adhesive layer may not contain the first conductive particles 10. The adhesive film according to this embodiment is suitably used when the insulating layer 6 is also provided on the second electronic member. That is, in this adhesive film, since the first conductive particles 10 are disposed on both sides of the adhesive film, the first conductive particles 10 can suitably break through the insulating layer 6 even when the insulating layer 6 is provided in the second electronic member.

EXAMPLES

Hereinafter, the present invention will be described more specifically based on Examples, but the present invention is not limited to the following Examples.

(Preparation of Solution A1)

50 g of a phenoxy resin (product name: PKHC, weight average molecular weight: 45000, manufactured by Union Carbide Corporation) was dissolved in a mixed solvent of toluene (boiling point: 110.6° C.) and ethyl acetate (boiling point: 77.1° C.) (at a mass ratio of toluene:ethyl acetate=1:1) to obtain a phenoxy resin solution having a solid content of 40% by mass. In this phenoxy resin solution, urethane acrylate (product name: UN7700, manufactured by Negami Chemical Industrial Co., Ltd.) and phosphoric acid ester dimethacrylate (product name: Light Ester P-2M, manufactured by Kyoeisha Chemical Co., Ltd.) as a radical polymerizable material, and 1,1-bis(t-hexylperoxy)-3,3,5-trimethylcyclohexane (product name: Perhexa TMH, manufactured by by NOF Corporation) as a curing agent were blended at a solid mass ratio of phenoxy resin:urethane acrylate:phosphoric acid ester dimethacrylate:curing agent=10:10:3:2 to obtain a solution A1.

The dendritic conductive particles (silver-coated copper particles, manufactured by Mitsui Mining & Smelting Co., Ltd., product name: ACBY-2) were used as conductive particles B1 (the first conductive particles).

(Preparation of Conductive Particles C1)

Benzoyl peroxide as a polymerization initiator was added to a mixed solution of divinylbenzene, styrene monomer, and butyl methacrylate, and polymerization reaction was performed by heating at high speed with uniform stirring to obtain a fine particle dispersion solution. This fine particles dispersion solution was filtered and dried under reduced pressure to obtain a block body which was an aggregate of fine particles. This block body was pulverized to prepare core bodies (resin particles) having an average particle diameter of 20 μm and different crosslinking density.

A palladium catalyst (product name: MK-2605, manufactured by Muromachi Technos Co., Ltd.) was supported on the surface of the above core bodies, and the core bodies were activated with an accelerator (product name: MK-370, manufactured by Muromachi Technos Co., Ltd.). The core body was added to a mixed solution of nickel sulfate aqueous solution, sodium hypophosphite aqueous solution, and sodium tartrate aqueous solution heated to 60° C. to perform a pre-electroless plating step. The mixture was stirred for 20 minutes, and it was confirmed that hydrogen bubbling stopped. A mixed solution of nickel sulfate, sodium hypophosphite, sodium citrate, and a plating stabilizer was added and stirred until pH was stabilized, and the postelectroless plating step was performed until hydrogen bubbling stopped. Subsequently, the plating solution was filtered, the filtrate was washed with water, and then dried with a vacuum dryer at 80° C. to prepare a nickel-plated conductive particles C1 (the second conductive particles).

[Example 1]
<Preparation of Adhesive Film>

45 parts by volume of the conductive particle B1 and 15 parts by volume of the conductive particle C1 were dispersed in 100 parts by volume of the solution A1 to obtain a mixed solution. The obtained mixed solution was applied on a fluororesin film with a thickness of 80 μm and dried with hot air at 70° C. for 10 minutes to remove the solvent to obtain an adhesive film (adhesive layer) with a thickness of 20 μm formed on the fluororesin film.

The properties of the obtained adhesive film when used as a connecting member were evaluated by the following procedure.

<Preparation and Evaluation of Connection Structure>
(Evaluation of Conductivity in Low-Pressure Connection)

Figure 3:
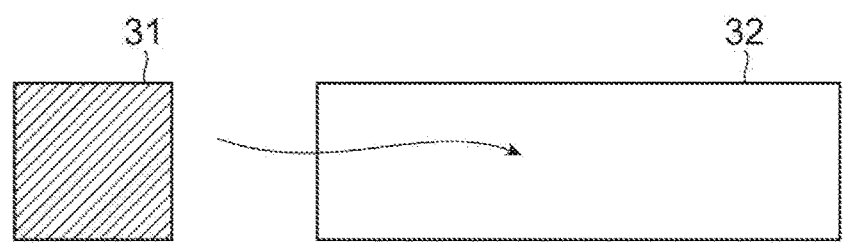
FIG. 3 is a schematic view showing a method of manufacturing a connection structure for evaluation in examples.
Figure 3:
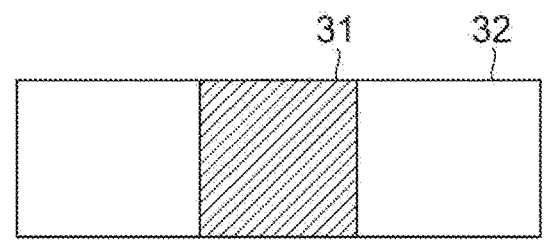
Figure 3:
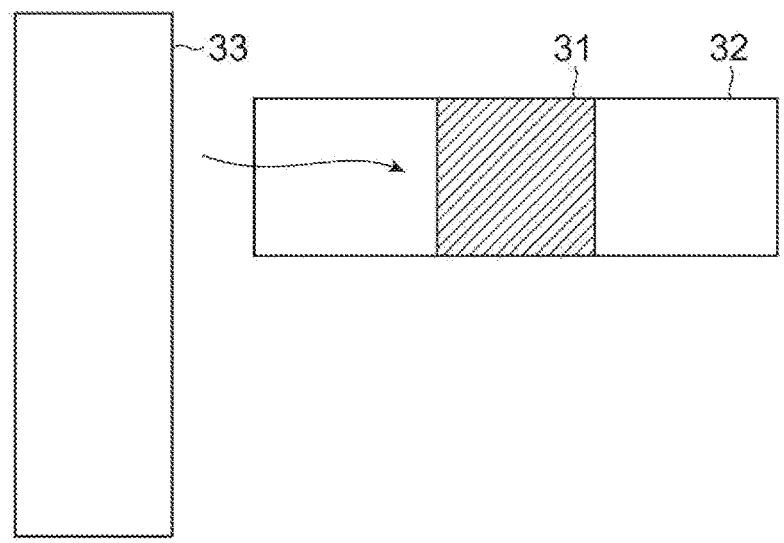
Figure 3:
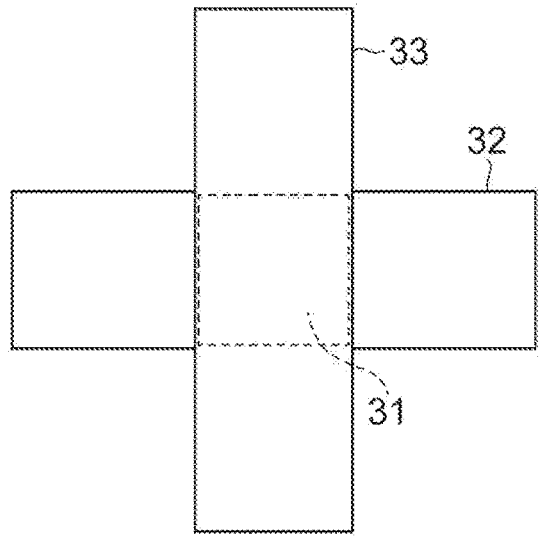
Figure 4:
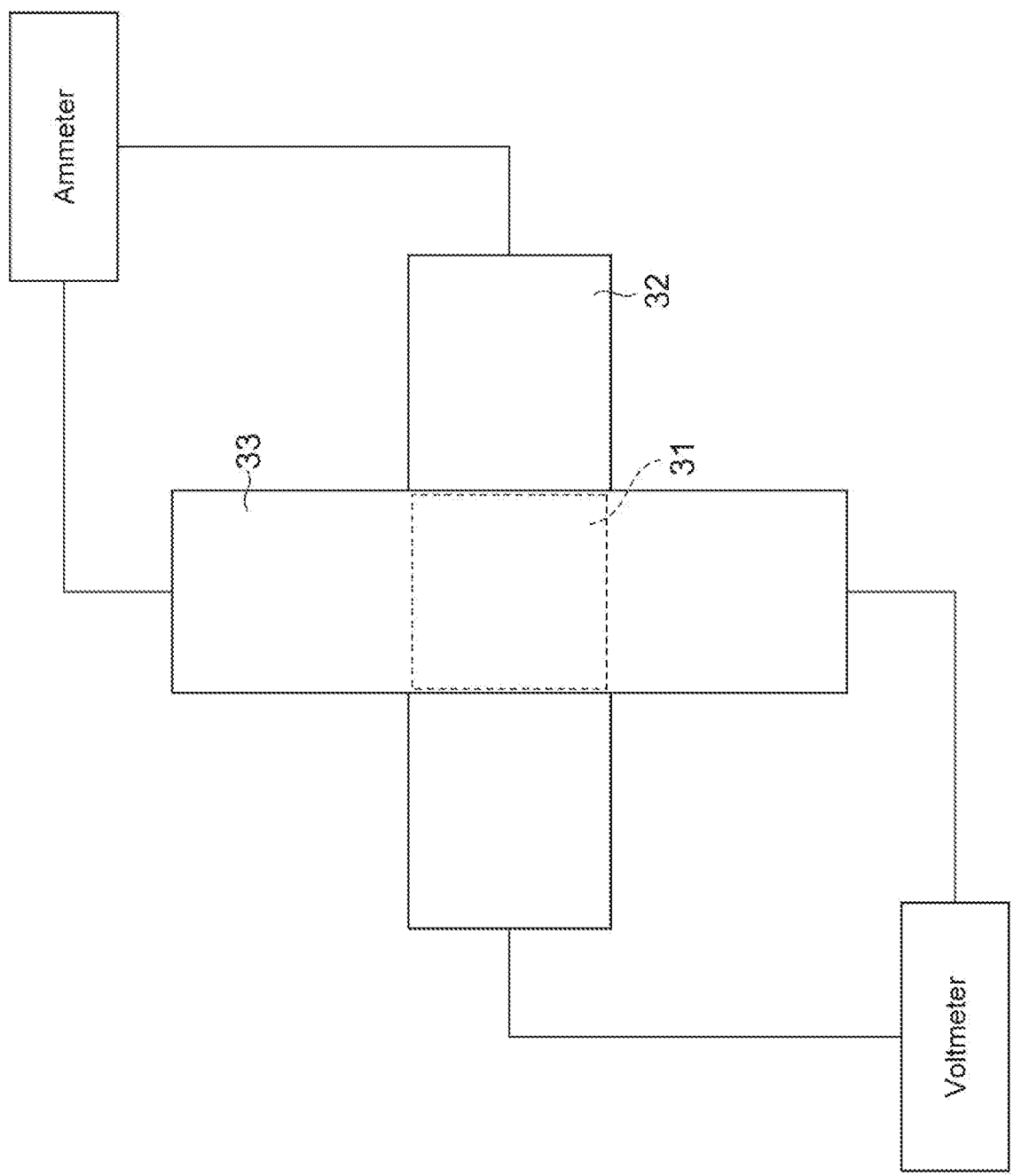
FIG. 4 is a schematic view showing a method of measuring connection resistance in examples.

As shown in FIGS. 3(a) and (b), an adhesive film 31 obtained by cutting the obtained adhesive film into 6 mm×6 mm was disposed substantially at the center of a 6 mm×50 mm copper foil 32 and bonded by heating and pressing (50° C., 0.1 MPa, 2 seconds) using BD-07 manufactured by Ohashi Seisakusho Co., Ltd. Subsequently, as shown in FIGS. 3(c) and (d), an aluminum laminate film (manufactured by FUJIMORI KOGYO CO., LTD., product name: Alumina Laminate Film ZBP-0513) 33 in which a polypropylene layer having a thickness of 2 μm was formed as an insulating layer on the surface of 50 mm×6 mm aluminum foil was prepared. The aluminum laminate film 33 was placed on the laminate of the copper foil 32 and the adhesive film 31 to cover the adhesive film 31, and the laminate was heated and pressed (150° C., 1.0 MPa, 10 seconds) by BD-07 manufactured by Ohashi Seisakusho Co., Ltd. Thus, a connection structure for evaluation in which the copper foil 32, the adhesive film 31, the insulating layer (polypropylene layer), and the aluminum foil were laminated in this order was obtained. An ammeter and a voltmeter were connected to the obtained connection structure as shown in FIG. 4, and the connection resistance (initial) was measured by a four-terminal method. The results are shown in Table 1.

(Evaluation of Reliability)

As shown in FIGS. 3(a) and (b), an adhesive film 31 obtained by cutting the obtained adhesive film into 6 mm×6 mm was disposed substantially at the center of a 6 mm×50 mm copper foil 32 and bonded by heating and pressing (50° C., 0.5 MPa, 2 seconds) using BD-07 manufactured by Ohashi Seisakusho Co., Ltd. Subsequently, as shown in FIGS. 3(c) and (d), an aluminum laminate film (manufactured by FUJIMORI KOGYO CO., LTD., product name: Alumina Laminate Film ZBP-0513) 33 in which a polypropylene layer having a thickness of 2 μm was formed as an insulating layer on the surface of 50 mm×6 mm aluminum foil was prepared. An aluminum laminate film 33 was placed on the laminate of the copper foil 32 and the adhesive film 31 to cover the adhesive film 31, and the laminate was heated and pressed (150° C., 3.0 MPa, 10 seconds) by BD-07 manufactured by Ohashi Seisakusho Co., Ltd. Thus, a connection structure for evaluation in which the copper foil 32, the adhesive film 31, the insulating layer (polypropylene layer), and the aluminum foil were laminated in this order was obtained.

An ammeter and a voltmeter were connected to the obtained connection structure as shown in FIG. 4, and the connection resistance (initial) was measured by a fourterminal method. When the terminal was connected to the aluminum laminate film 33, the resistance was measured after the terminal was strongly pressed and sufficiently conducted. In addition, a heat cycle test in which a heat cycle of holding at −20° C. for 30 minutes, increasing the temperature to 100° C. over 10 minutes, holding at 100° C. for 30 minutes, and decreasing the temperature to −20° C. over 10 minutes was repeated 500 times was performed on the connection structure using TSA-43EL manufactured by ESPEC CORP., and then the connection resistance (after the heat cycle test) was measured in the same manner as described above. The results are shown in Table 1.

[Comparative Example 1]

A preparation of an adhesive film, and a preparation and evaluation of a connection structure were performed in the same manner as in Example 1 except that the conductive particles B1 (first conductive particles) were not used in the adhesive layer.

[Comparative Example 2]

A preparation of an adhesive film, and a preparation and evaluation of a connection structure were performed in the same manner as in Example 1 except that the conductive particles C1 (second conductive particles) were not used in the adhesive layer.

TABLE 1

|  |  | Example 1 | Comparative Example 1 | Comparative Example 2 |
|---|---|---|---|---|
| Conductivity in Low-Pressure Connection (connection resistance/Ω) |  | 0.48 | 2.6 | 3.9 |
| Reliability (connection resistance/Ω) | Initial | 0.22 | 1.56 | 0.76 |
|  | After heat cycle test | 0.35 | 22.5 | 8.7 |

REFERENCE SIGNS LIST

1: first electronic member, 2: second electronic member, 3: adhesive film (adhesive layer), 4: first substrate, 5: first electrode, 6: insulating layer, 7: second substrate, 8: second electrode, 10: first conductive particle, 11: second conductive particle, 20: connection structure, 21: connecting member.

The invention claimed is:

1. A method of manufacturing a connection structure, comprising disposing an adhesive layer between a first electronic member comprising a first substrate and a first electrode formed on the first substrate and a second electronic member comprising a second substrate and a second electrode formed on the second substrate, and pressure-bonding the first electronic member and the second electronic member via the adhesive layer such that the first electrode and the second electrode are electrically connected to each other, wherein the first electrode has a first surface facing the first substrate and a second surface opposite the first surface facing the second electronic member, and wherein the first electronic member further comprises an insulating layer formed on the second surface of the first electrode facing the second electronic member, and wherein the adhesive layer comprises:
a first conductive particle being a dendritic conductive particle; and
a second conductive particle being a conductive particle other than the first conductive particle and the second conductive particle comprising a non-conductive core and a conductive layer provided on the core.

2. The method according to claim 1, wherein the conductive layer comprises at least one selected from the group consisting of gold, nickel, and palladium.

3. The method of manufacturing a connection structure according to claim 1, wherein the insulating layer comprises a polyolefin.

4. The method of manufacturing a connection structure according to claim 1, wherein the first electronic member is formed by forming the first electrode over the first substrate and then disposing the insulating layer on the second surface of the first electrode.

5. The method of manufacturing a connection structure according to claim 1, wherein a thickness of the insulating layer is 2 μm to 8 μm.

6. The method of manufacturing a connection structure according to claim 1, wherein, by the pressure-bonding of the first electronic member and the second electronic member via the adhesive layer, the first conductive particle breaks through the insulating layer to enable electrical connection of the first electrode and the second electrode to each other.

7. A connection structure comprising:
a first electronic member comprising a first substrate, a first electrode formed on the first substrate;
a second electronic member comprising a second substrate and a second electrode formed on the second substrate;
wherein the first electrode has a first surface facing the first substrate and a second surface opposite the first surface facing the second electronic member, and wherein the first electronic member further comprises an insulating layer formed on the second surface of the first electrode facing the second electronic member; and
a connecting member connecting the first electrode and the second electrode electrically to each other,
wherein the connecting member comprises:
a first conductive particle being a dendritic conductive particle; and
a second conductive particle being a conductive particle other than the first conductive particle and the second conductive particle comprising a non-conductive core and a conductive layer provided on the core.

8. The connection structure according to claim 7, wherein the conductive layer comprises at least one selected from the group consisting of gold, nickel, and palladium.

9. The connection structure according to claim 7, wherein the insulating layer comprises a polyolefin.

10. The connection structure according to claim 7, wherein a thickness of the insulating layer is 2 μm to 8 μm.

11. The connection structure according to claim 7, wherein the insulating layer has breaks through it caused by the first conductive particle such that the connecting member can connect the first electrode and the second electrode electrically to each other.

12. The method of manufacturing a connection structure according to claim 11, wherein the first electronic member is formed by forming the first electrode over the first substrate and then forming the insulating layer by disposing an insulating film comprising the polyolefin on the second surface of the first electrode.

* * * * *